US006473351B2

(12) United States Patent
Tomanek et al.

(10) Patent No.: US 6,473,351 B2
(45) Date of Patent: Oct. 29, 2002

(54) NANOCAPSULES CONTAINING CHARGED PARTICLES, THEIR USES AND METHODS OF FORMING SAME

(75) Inventors: David Tomanek; Richard Enbody; Kwon Young-Kyun, all of East Lansing; Mark W. Brehob, Ann Arbor, all of MI (US)

(73) Assignee: Board of Trustees operating Michigan State University, East Lansing, MI (US)

( * ) Notice: Subject to any disclaimer, the term of this patent is extended or adjusted under 35 U.S.C. 154(b) by 0 days.

(21) Appl. No.: 09/927,086

(22) Filed: Aug. 9, 2001

(65) Prior Publication Data

US 2002/0027819 A1 Mar. 7, 2002

Related U.S. Application Data

(63) Continuation of application No. PCT/US00/03573, filed on Feb. 11, 2000.
(60) Provisional application No. 60/120,023, filed on Feb. 12, 1999.

(51) Int. Cl.[7] .................................................. G11C 7/00
(52) U.S. Cl. ...................................... 365/215; 365/151
(58) Field of Search .............................. 365/215, 151, 365/137, 185.01

(56) References Cited

U.S. PATENT DOCUMENTS

| 5,780,101 A | 7/1988 | Nolan et al. |
| 5,641,466 A | 6/1997 | Ebbesen et al. |
| 5,698,175 A | 12/1997 | Hiura et al. |
| 5,753,088 A | 5/1998 | Olk |
| 6,208,553 B1 * | 3/2001 | Gryko et al. ............... 365/151 |
| 6,278,231 B1 * | 8/2001 | Iwasaki et al. ............. 313/310 |

FOREIGN PATENT DOCUMENTS

| DE | 199917848 A1 * | 10/2000 | ............ C12M/1/40 |
| EP | 09510047 A2 | 3/1999 | |

OTHER PUBLICATIONS

Luthi, et al., Parallel nanodevice fabrication using a combination of shadow mask and scanning probe methods, Applied Physics Letters 75, 1314–1316 (Aug. 30, 1999).
Petr Kral, et al. Laser–Driven Atomic Pump, Physical Review Letters 82, 5373–5376, (Jun. 28, 1999).
Luzzi, et al., The Synthesis, Structure and Properties of Peapods, Cats and Kin, In: Science & Application of Nanotubes, ed. D. Tomanek; Kluwer (2000), 71, Proceedings of Nanotube—99 Conference, East Lansing, (Jul. 24–27, 1999).

(List continued on next page.)

Primary Examiner—Richard Elms
Assistant Examiner—Anh Phung
(74) Attorney, Agent, or Firm—Harness, Dickey & Pierce, P.L.C.

(57) ABSTRACT

Nanomechanisms are employed in nanomemory elements which, in turn, are employable in nanoscale memory devices. A nanoscale particle is enclosed within a nonocapsule to create a bistable device which is both readable and writable in a variety of ways. A nonamechanism for use in a nanoscale memory element includes a first element in the form of a nanoassembly having a cavity and second element in the form of a nanostructure which is removeably disposed within the cavity. In one embodiment, the nanoassembly is demonstrated as a $C_{480}$ capsule and the nanostructure is demonstrated as a charged hd 60 fullerene molecule. The nanoscale memory devices combine high switching speed, high packing density and stability with non0volatility of the stored data.

83 Claims, 7 Drawing Sheets

OTHER PUBLICATIONS

Smith, et al, Encapsulated C60 in carbon nanotubes, Nature, vol. 396, 26, 323–324, (Nov. 1998).

Kwon, et al. "Bucky–Shuttle" Memory Device: Synthetic Approach and Molecular Dynamics Simulations, Phys. Rev. Lett. 82, 1–4 (1999).

Brehob, et al., The Potential of Carbon–based Memory Systems, Proceedings of the IEEE Conference MTDT '99. Ed. Rajsuman & Wik., 110 (1999).

International Search Report PCT/US00/03573.

* cited by examiner

NANOCAPSULES CONTAINING CHARGED PARTICLES, THEIR USES AND METHODS OF FORMING SAME

CROSS-REFERENCE TO RELATED APPLICATIONS

This application is a continuation of PCT Application No. PCT/US00/03573 filed Feb. 11, 2000, designating the United States, which claims priority from provisional U.S. application Ser. No. 60/120,023, filed Feb. 12, 1999.

BACKGROUND OF THE INVENTION

Carbon nanotubes consisting of seamless and atomically perfect graphitic cylinders generally only a few nanometers in diameter have been synthesized in bulk quantities. The unusual combination of their molecular nature and micrometer-size length gives rise to the uncommon electronic properties of these systems. Electrical transport measurements for individual nanotubes indicate that these systems behave as genuine quantum wires, nonlinear electronic elements or transistors.

SUMMARY OF THE INVENTION

Computer simulations indicate that nanotubes containing at least one charged particle, otherwise referred to herein as bucky-shuttles, exhibit an unusual dynamical behavior making such mechanisms useful for nanoscale memory devices. Such nanoscale memory devices combine high switching speed, high packing density and stability with non-volatility of the stored data.

The nanoscale mechanisms including at least one charged particle, generally in the form of a fullerene molecule contained within at least one carbon nanotube can be produced by thermally annealing diamond powder of an average diameter of 4–6 nm via a detonation method reported by Toron Company, Ltd. According to this detonation method diamond powder is heated in a graphite crucible in an inert argon atmosphere at 1800° C. for 1 hour. This treatment transforms the diamond powder into graphitic nanostructures as seen in transmission electron microscope images. Interestingly, a large portion of the material produced under this method consists of multi-walled capsules.

Figure 5:
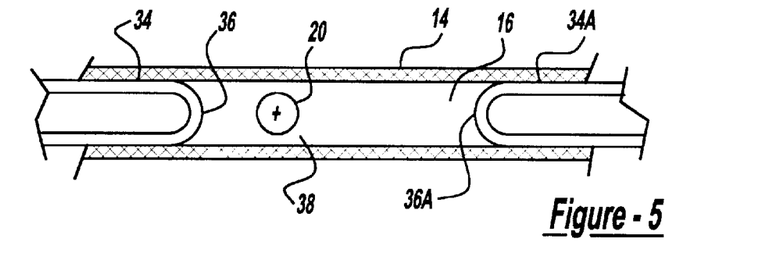
FIG. 5 is a cross-sectional side view of an alternative nanomechanism configuration useful as a data storage element in accordance with the teachings of the present invention.

Alternative bucky shuttle structures sometimes referred to as "nano-peapod", similar to the structure shown in FIG. 5 can be synthesized by acid purifying carbon nanotubes produced by the pulsed laser ablation of a graphite target impregnated with 1.2% of Ni/Co catalyst as reported by Smith et al. NATURE, 396, 323 (1998). Similarly, nanopeapods have been produced by carbon arc discharge using ~5% of Ni/Y catalyst as reported by Luzzi et al., Science and Application of Nanotubes, p. 67 (2000).

DETAILED DESCRIPTION OF THE DRAWINGS

DETAILED DESCRIPTION OF THE INVENTION

Figure 1:
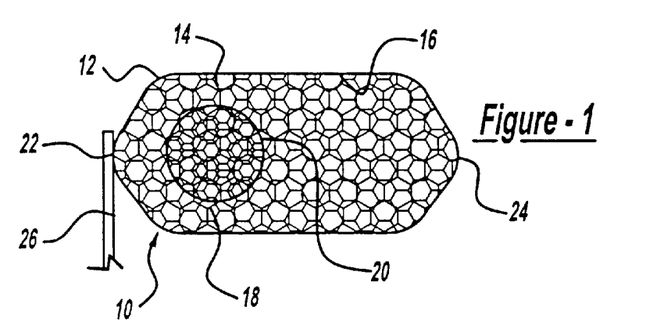
FIG. 1 is a structural model of a nanomechanism including a K@C$^+_{60}$ charged nanostructure contained within a C$_{480}$ nanoassembly.

Referring to FIG. 1, a nanomechanism 10 for use in a nanoscale memory element is illustrated as including a first element 12 in the form of a nanoassembly 14 having a cavity 16 and a second element 18 in the form of a nanostructure 20 which is movably disposed within the cavity.

Figure 6:
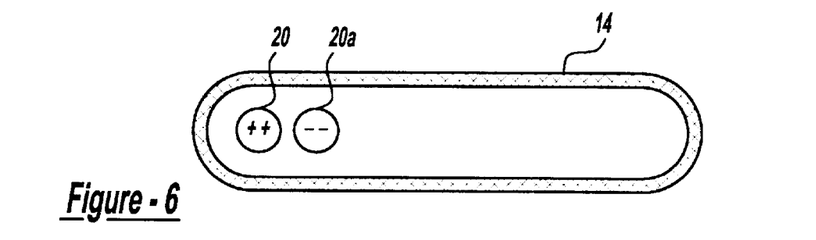
FIG. 6 is a side view of an alternative nanomechanism configuration useful as a data storage element in accordance with the teachings of the present invention.

While the nanomechanism will be described in terms of moving the nanostructure relative to the nanoassembly, it should be understood by those skilled in the art that the nanostructure can be held in a fixed position with the nanoassembly being moved relative thereto to effectuate a change in state as will be described below. Additionally, it is fully comprehended that the nanostructure and nanoassembly can be configured to both be movable. For illustrative purposes, the nanoassembly is demonstrated as a $C_{480}$ capsule and the nanostructure is demonstrated as a charged $C_{60}$ fullerene molecule. It should be noted by those skilled in the art that the nanostructure 20 can also be in the form of other charged particles, molecules or nanotubes provided such can be housed within the cavity of a nanotube nanoassembly. Further, as shown in FIG. 6, two or more nanostructures represented by reference numerals 20 and 20A, may be disposed within a single nanoassembly. It has been determined that the above described nanomechanism can be utilized in nanomemory elements 30 such as those illustrated in FIGS. 1, 3, 7, 8 and 9 to write and read information fast and reliably. Additionally, the data can be readily analyzed and stored in a non-volatile manner.

Figure 2:
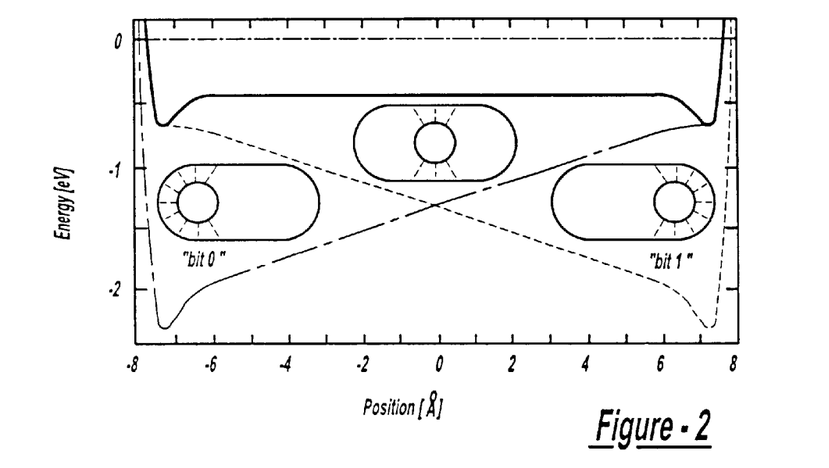
FIG. 2 is a chart illustrating the potential energy of K@C$^+_{60}$ as a function of its position with respect to the nanoassembly in a zero field (solid line) and switching field $E_S$=0.1 V/Å (dashed lines)
Figures 3A, 3B:
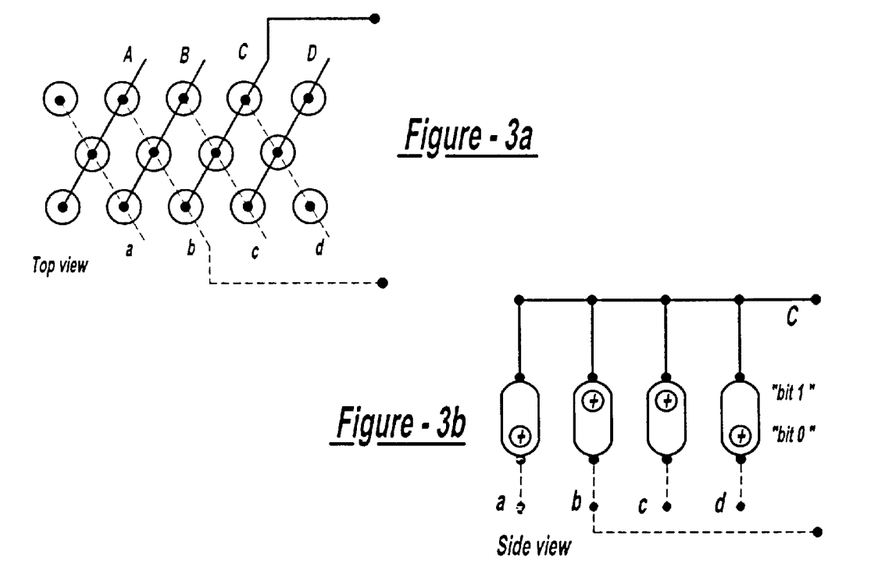
FIG. 3a is a top schematic view of a high-density memory board.
FIG. 3b is a side schematic view of a high-density memory board illustrating a switching voltage applied between conductors b and C, wherein the corresponding bit information is stored in memory element "bC"

The energetics of the $C_{60}$ molecule within the $C_{480}$ is demonstrated in FIG. 2. The ends of the outer capsule are halves of the $C_{240}$ fullerene, a preferred structure to hold a $C_{60}$ molecule at an inter-wall distance of 3.4 Å. These end-caps connect seamlessly to the cylindrical portion of the capsule, a 1.5 nm long segment of the nanotube. The interaction between the unmodified $C_{60}$ molecule and the enclosing capsule is similar to that found in graphite, $C_{60}$ crystals and nanotube bundles; that is, it is dominated by a Van der Waals and a weak covalent inter-wall interaction that is proportional to the contact area between the constituents. An additional image charge interaction, which is nearly independent of the $C_{60}$ position, occurs if the $C_{60}$ molecule carries a net positive charge, as will be discussed below. It should be recognized that the Van der Waals interaction stabilizes the $C_{60}$ molecule at either end of the capsule, where the contact area is largest. This is reflected in the potential energy behavior shown in FIG. 2, and results in the likelihood of $C_{60}$ to be found near the ends of the capsule. In view of the foregoing, the concept of utilizing a nanomechanism, as an information storage medium will now be described.

In order to move the nanostructure 20 from one end of the nanoassembly 14 to the other (the molecular analog of writing) and to determine its position within the nanoassembly (the molecular analog of reading) most efficiently, the nanostructure contained within the nanoassembly should carry a net charge. This net charge can be accomplished, for example, by utilizing a $K@C_{60}$ complex, which can be formed spontaneously under synthesis conditions in presence of potassium (K), wherein the valence electron of the encapsulated K atom is completely transferred to the $C_{60}$ shell. The $K@C_{60}$ complex, when in contact with the neutral $C_{480}$ nanoassembly, spontaneously transfers this valence electron from the $C_{60}$ shell to the enclosing nanoassembly, thus resulting in a $K@C_{60}^+$ ion enclosed in the $C_{480}$ nanoassembly.

The writing process corresponds to switching the state or equilibrium position of the $C_{60}^+$ ion between a first end 22 of the nanoassembly, hereinafter the "bit 0" end and a second end 24 of the nanoassembly, hereinafter the "bit 1" end. To accomplish a change in state, an electric field must be applied within the cavity 16 of the nanoassembly 14. Preferably, the nanoassembly 14 is provided with one or more electrodes 26 which are attached during the formation of the nanoassembly to reduce the field screening by the nanoassembly.

The energetics of $C_{60}^+$ in absence of an applied field and in the switching field of $E_S=0.1$ V/Å, generated by applying a voltage of ~1.5 V between the nanoassembly ends, is displayed in FIG. 2. One of the local minima becomes unstable above a critical field strength, causing the $C_{60}^+$ ion to move to the only stable position. Since the switching field $E_S=0.1$ V/Å is relatively small, it should not have a dramatic effect, if any, on the integrity of the nanomechanism, since graphitic structures disintegrate only in fields greater than 3.0 V/Å.

Figure 13:
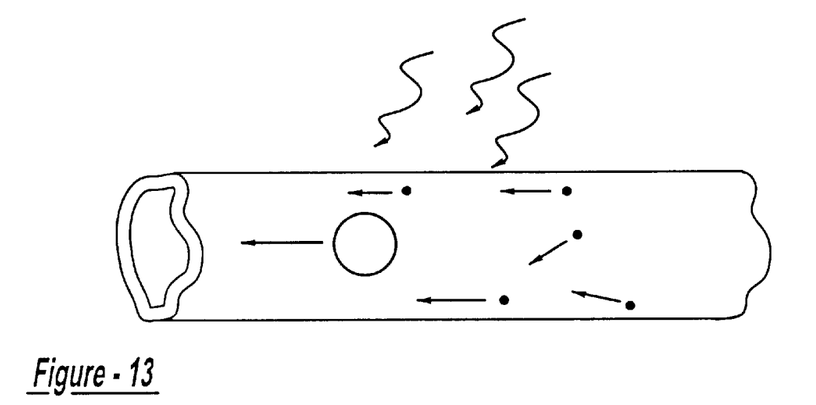
FIG. 13 is a schematic view of a nanoscale memory element including a laser activator to generate a net current to displace the nanostructure within the nanoassembly, thus switching between states.

An alternative way to displace the nanostructure within the nanoassembly could be achieved by irradiating the nanoassembly by a laser beam, FIG. 13, thus inducing an electric current capable of dragging along the nanostructure, as reported by Kral and Tomanek in Physical Review Letters 82, 5373 (1999), which is hereby incorporated by reference as if fully set forth herein.

Figure 16:
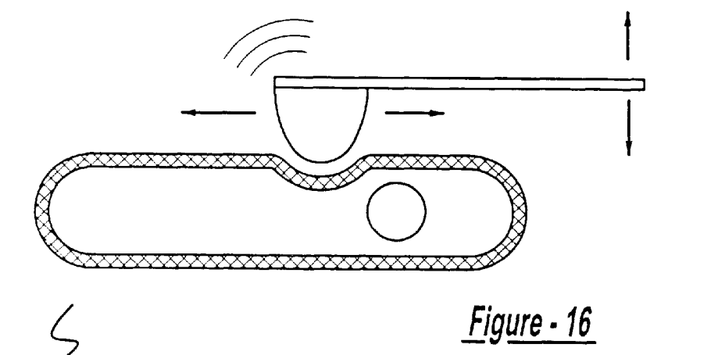
FIG. 16 is a schematic view of a nanoscale memory element including a nanoprobe detector to measure local changes of electron distribution or elastic deformations to distinguish states.

Another method to displace the nanostructure within the nanoassembly would make use of the tip of a Scanning Probe Microscope, such as Atomic Force Microscope (AFM), illustrated in FIG. 16. Locally applied force would deform the nanoassembly in such a way to cause the nanostructure to move from one end to the other.

The information, physically stored in the position of the nanostructure, i.e., $C_{60}^+$ ion contained within the nanoassembly, is stable and does not change unless a field greater than the switching field is present in the cavity 16 of the nanoassembly 14, resulting in non-volatility of the stored information. In view of the data storage capability of the nanomechanisms of the present invention, the information generated by the nanomechanisms can be read in a number of ways. By way of a non-limiting example, a read function can be carried out by determining the state of the device by examining its polarity, detecting the movement of the nanostructure or examining its resistance.

Figure 15:
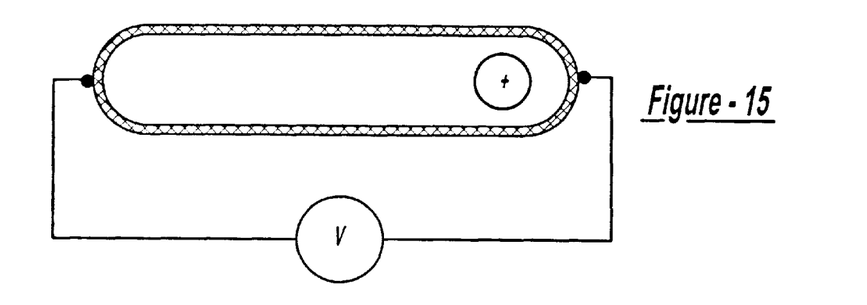
FIG. 15 is a schematic view of a nanoscale memory element including a polarity detector to measure polarity to distinguish states.

Examining the polarity of the nanoassembly would indicate the proximity of the charged nanostructure within the nanoassembly and, thus, its location. The polarity can be examined by measuring the difference in the electrochemical potential between the ends 22 and 24. To measure the polarity, a voltage meter can be connected to the nanomechanism along both ends as shown in FIG. 15. The voltage meter would detect different polarity depending on the position of a nanostructure.

Figure 9:
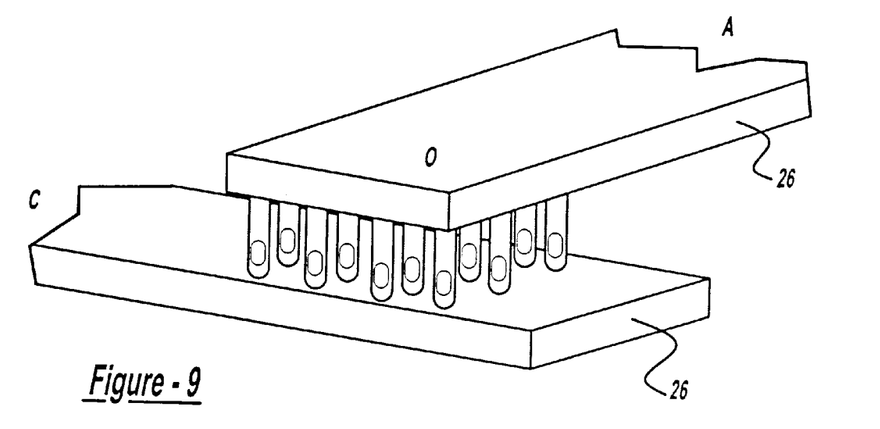
FIG. 9 is a perspective view of a nanoscale memory element including a plurality of nanomechanisms extending between a dual electrode activator.

A destructive read process would involve measuring the current pulse in the connecting electrodes, caused by the motion of the charged nanostructure due to an applied probing voltage. The total charge transfer associated with the current pulse (which is one electron in the present example) may be increased by connecting several nanoassemblies in parallel to represent one bit as shown in FIG. 9, and by using higher charged complexes such as $La@C_{82}^{3+}$ carrying a net charge of +3e, instead of the $K@C_{60}^+$ ion that carries a net charge of +1e. The current pulse can be measured by using a current amplifier similar to the differential amplifiers used in DRAM cells. While it may be difficult to precisely detect the current caused by the motion of a single electron change, this becomes much more accurate when multiple charges cause the current pulse as in the array embodiments described below.

Figure 7:
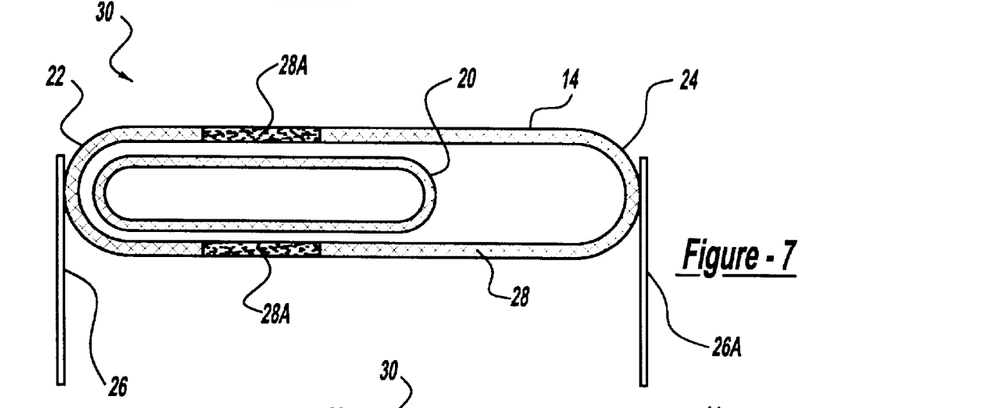
FIG. 7 is a side view of a nanoscale memory device including a nanomechanism having distinct conductive and non-conductive segments and a dual electrode activator to accomplish a switching between states.

Another method of carrying out a read function involves utilizing a nanoassembly having alternating conductive and non-conductive segments 28 and 28A, respectively. By using this type of nanoassembly, the resistance of the entire nanomemory device would be made to vary based upon the location of the (conducting) nanostructure within the nanoassembly. If the nanostructure is located along the first end 22 (on the left), as shown in FIG. 7, the resistance of the nanomemory device is less than when the nanostructure is at the second end 24 (on the right). When the nanostructure is at the first end, it acts as an electrical bridge allowing current to flow between the ends of the nanoassembly. In contrast, when the nanostructure is on the right, no conducting path exists between the ends of the nanoassembly, thus yielding a higher resistance which can be measured. The conductive and non-conductive segments of the nanoassembly 14 can be made of different materials or may optionally be made from the same material but differ in atomic arrangement, which in case of nanotubes is referred to as chirality. The resistance can be measured in a number of ways including, for example, attaching a resistor to the electrodes in series with the nanomechanism. A small potential difference would then be applied across both the resistor and the nanomechanism, with the difference between the resistor and nanomechanism being measured.

Figure 8:
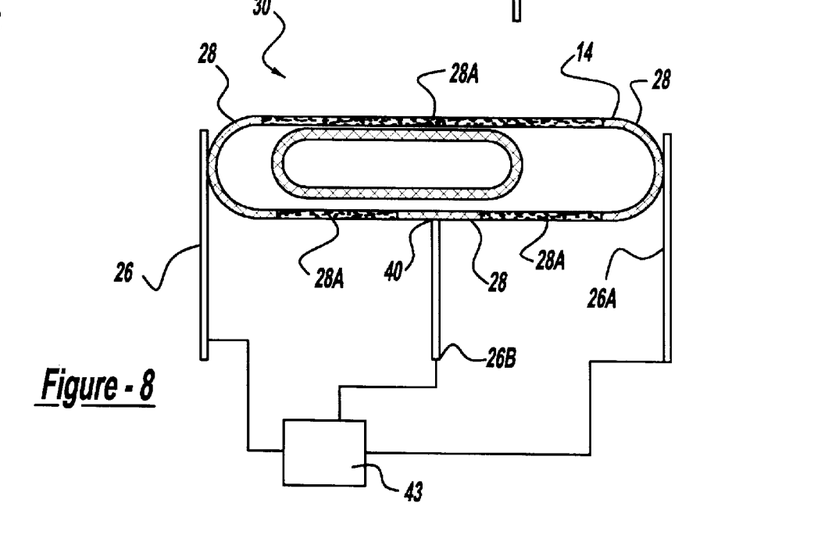
FIG. 8 is a side view of a nanoscale memory device including a nanomechanism having distinct conductive and non-conductive segments and a triple electrode activator to accomplish a switching between states.
Figure 14:
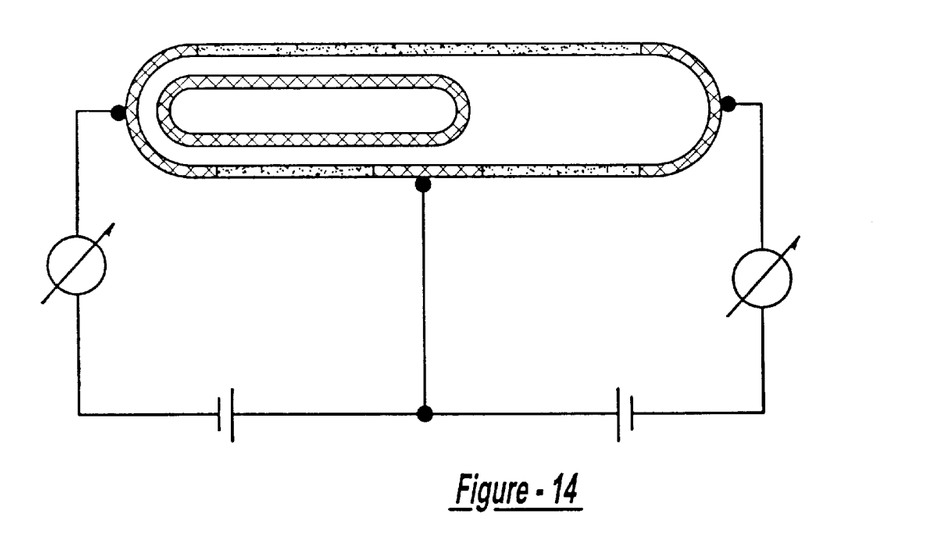
FIG. 14 is a schematic view of a nanoscale memory element including a detector to measure electrical resistance to distinguish states.

The read function can also be carried out by employing a plurality of spaced apart electrodes attached to a nanomechanism as illustrated in FIGS. 8 and 14. First and second electrodes 26 and 26A would be located at opposite ends of the nanoassembly 14 and separated from each other by one or more insulating segments 28A; a third electrode 26B would be disposed along the midpoint 40. The three electrodes are operationally associated with control logic 43. Preferably, each of the electrodes are equidistantly spaced from adjacent electrodes. When the nanostructure is at one end, it provides a low-resistance connection between this end and the electrode at the mid-point, whereas the resistance between the mid-point electrode and the other end remains high. Therefore, the location of the nanostructure is detectable by comparing the resistance between the mid-point electrode and one end to the resistance between the mid-point electrode and the other end using a resistor as described above.

Another method to detect the location of the nanostructure within the nanoassembly would make use of the tip of a Scanning Probe Microscope, such as Atomic Force Microscope (AFM). Due to the fact that the nanoassembly is locally less compressible near the nanostructure, as illustrated in FIG. 16, the Scanning Probe Microscope would show a different deflection when in the vicinity of the nanostructure.

Figure 17:
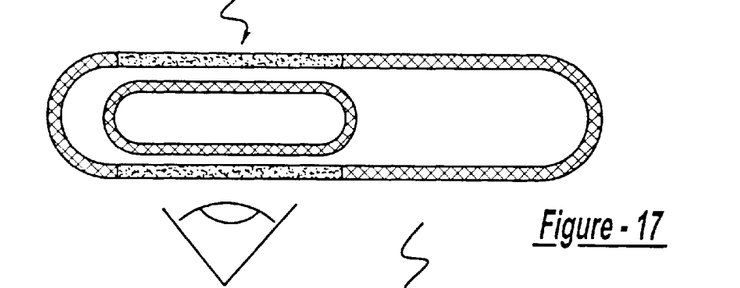
FIG. 17 is a schematic view of a nanoscale memory element in the "bit 0" state where the opaque nanostructure obstructs a light beam from transmission through a transparent section of the nanoassembly.
Figure 17A:
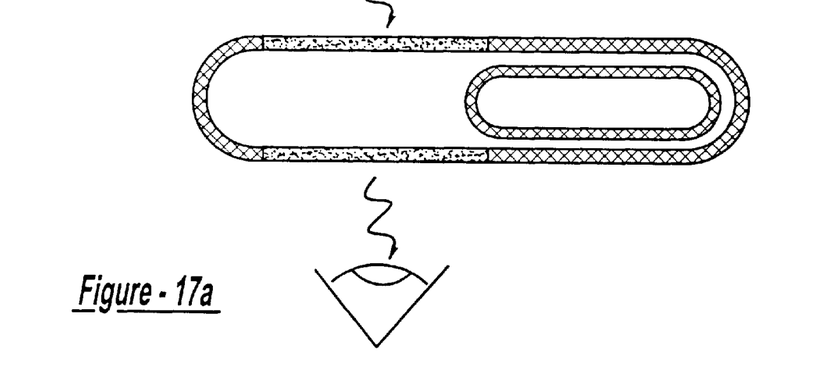
FIG. 17A is a schematic view of a nanoscale memory element in the "bit 1" state, where the opaque nanostructure does not obstruct a light beam.

Still another way to detect the position of the nanostructure within the nanoassembly relies on the fact that the opaque nanostructure, when located near the left end ("bit 0") of the nanoassembly, may obstruct a beam of light from transmission through a window consisting of a transparent section of the nanoassembly, as shown in FIG. 17. When the nanostructure is located near the right end ("bit 1") of the nanoassembly, as shown in FIG. 17A, the beam of light is not obstructed, but rather transmitted through this window and can be detected.

Unlike in most conventional solid state random access memory elements (such as DRAM or SRAM) where information has to be sustained by an external power source, the non-volatility of the stored information, mentioned above, results from a relatively deep trap potential near the "bit 0" or "bit 1" ends of the nanomechanism and thus does not rely upon external power. Thermal stability and non-volatility of data depend on the depth of this trap potential, which in turn can be adjusted by changing the encapsulated fullerene complex. For example, the calculated trap potential depth of 0.24 eV for the $K@C_{60}^+$ ion near the ends of the nanoassembly in zero field suggests that stored information should be stable well beyond room temperature and require temperatures on the order of 3000 K to be destroyed. Further improvement of the thermal stability can be achieved using higher charged endohedral complexes containing di- or trivalent donor atoms, such as $La@C_{82}^{3+}$ as mentioned above.

When targeting high storage densities, the addressability of the stored information becomes important. One possible way to realize a high-density memory board is presented in FIG. 3. Maximum density is achieved by packing the nanotube memory elements in a honeycomb fashion. Rows of nanoassemblies can be connected at the top and at the bottom by "nanowire" electrodes in such a way, that a single memory element is addressed at their crossing point. Applying a switching voltage between two crossing electrodes [e.g. the bC pair in FIG. 3(b)] will generate a field sufficient for switching only in that memory element [e.g. labeled bC], whereas fields inside other memory elements, in particular the rows of elements connected to electrode c and electrode B, are too small to initiate switching. As in most solid-state memory devices, many memory elements can be addressed in parallel using such an addressing scheme. This arrangement applies both for the writing and the reading processes described above, and allows for multiple bits to be written and read in parallel.

Figure 10:
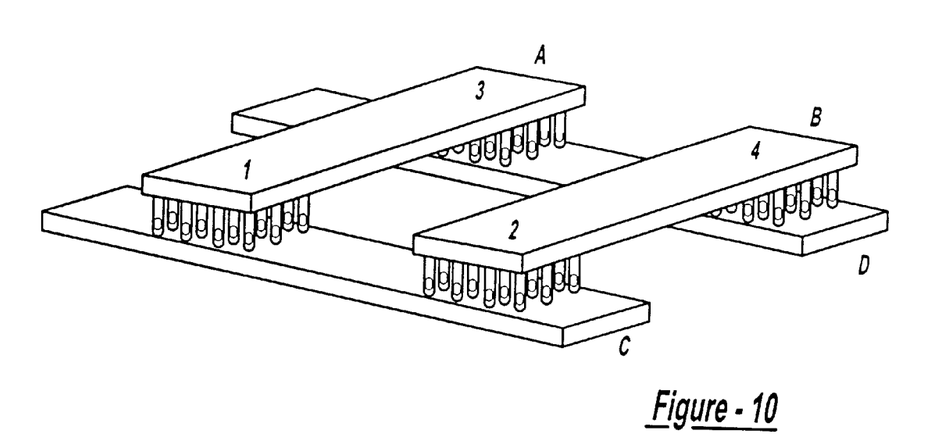
FIG. 10 is a perspective view of a four-bit array of nanoscale memory elements.

In a similar fashion, a matrix of single bit nanoscale memory elements, as illustrated in FIG. 10, can also be employed as a nanomemory device. A large quantity of nanomechanisms per unit area, i.e., such as those described in articles by A. Thess et al., SCIENCE, Vol. 273, pg. 483 (1996); G. Che et al., Jpn. J. Appl. Phys., Vol 37, pg. 605 (1988) and S. J. Tans et al., NATURE, vol. 393, 49 (1998) can be attached to the electrode. A similar technique could be used to create a high quantity of nanomechanisms per unit area disposed between two conducting layers to form a single bit element as illustrated in more detail in FIG. 9. In general, the number of nanomechanisms per bit will depend upon the minimum line size of the lithography process used for the electrodes. For example, for lithography processes employing a 70 nm wire width there could be nearly 1,000 nanomechanisms used to store a single bit of information. Writing can be done by assuming that a voltage differential of 2.0 V will move the nanostructures from one end of the nanoassembly to the other (field of about or exceeding 0.1 V/Å, needed to move a $C_{60}^+$ ion within the nanoassembly, will thus be achieved if the distance between the two ends is below about 2 nm). Thus, as shown in FIG. 10, in order to write the information "bit 0" to memory element "4" one applies a +1.0 V potential to wire B while applying a −1.0 V potential to wire D. If all the other electrodes are held at ground, only at the addressed element will there be a strong enough electric field to move the nanostructures across the nanoassemblies. A "bit 1" information would be written to that element by reversing the voltage at the same electrodes and holding all others at ground. Writing to an entire row (or column) would be a two-stage process, as the "bit 0" and "bit 1" information would have to be written at different times.

Figure 11:
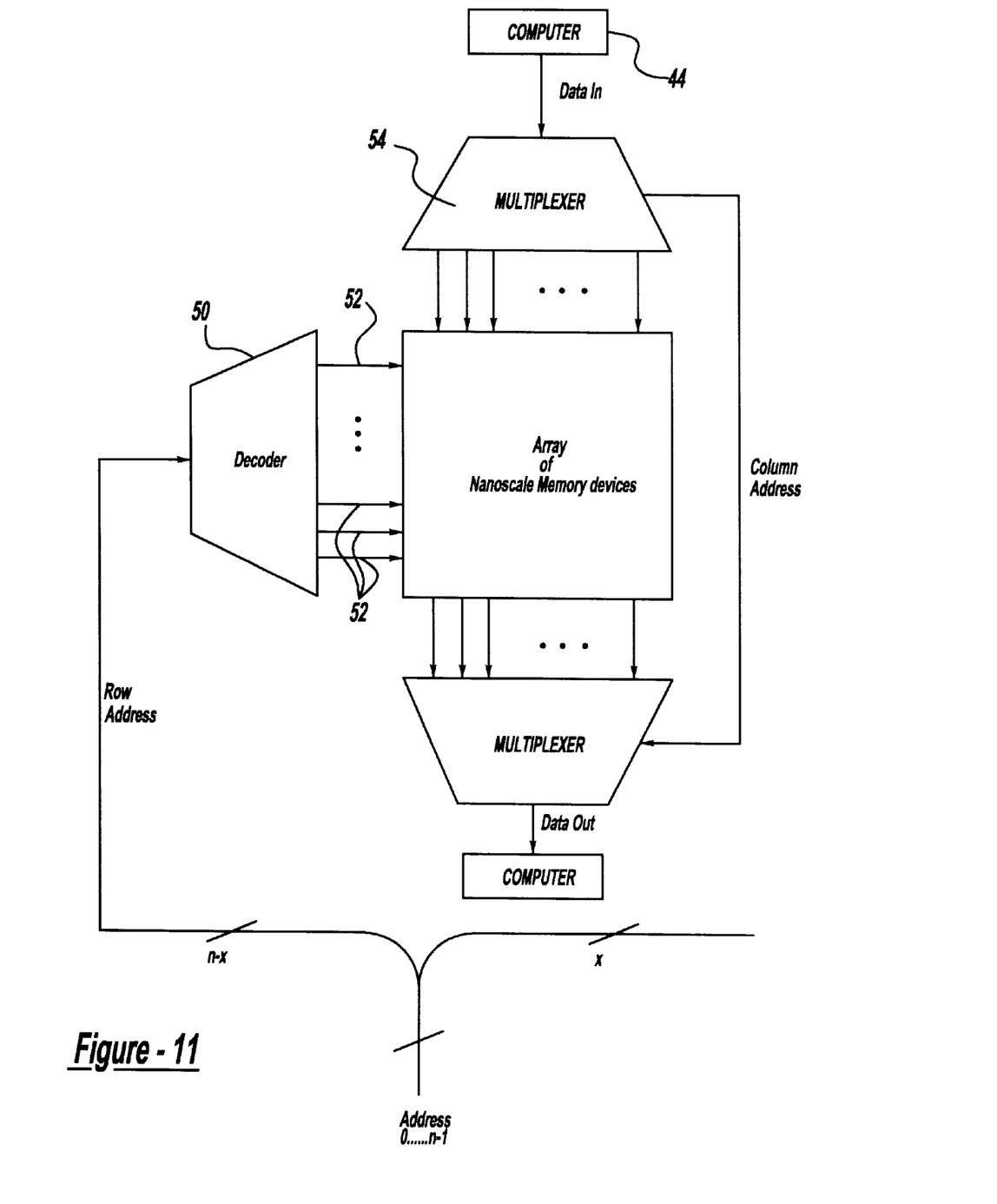
FIG. 11 is a schematic view of the circuitry used to address a nanoscale memory device in accordance with the teachings of the present invention.
Figure 12:
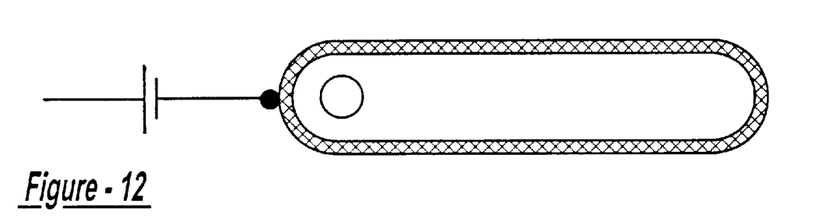
FIG. 12 is a schematic view of a nanoscale memory element including an electrode attached at a first end to nanomechanism and at second end to a power source.

The memory arrays of the present invention, which are random accessible in nature, can be fabricated to replace traditional DRAM capacitor/transistor memory cells with a memory-cell made of one or more nanomemory devices. FIG. 11 illustrates a contemporary memory array employing an array of nanoscale memory devices rather than DRAM cells which are now commonly used in microelectronic applications. As shown, the decoder 50 selects the appropriate wire(s) 52 for reading and writing as described above. The multiplexer (MUX) 54 collects the signals from the nanoscale memory devices for output. The decoder and MUX are conventional devices which can be fabricated using conventional VLSI techniques or can be fabricated from nanotubes.

Now, consider a destructive read with a large number of nanoassemblies per unit area. A "forest" of nanoassemblies would result in movement of a large number of charged ions whose movement would be detectable. While the data will have been destroyed in the process of doing the read, the data can be written back later, similar to how data are handled in a traditional DRAM.

The above described nanomemory devices have a number of useful features. They are non-volatile; the device itself switches very quickly; and they appear to be useful in modern lithography processes.

Under an alternative embodiment, nanomemory devices can be fabricated wherein the metal or polysilicon electrodes are in whole or in part replaced with "carbon nanowires". These so-called nanowires are in the form of conductive carbon nanotubes. Each bit of memory would now use only a single nanoscale memory device. The reading and writing of the data in the nanomemory devices would be achieved as described above and as illustrated in FIG. 11, by way of non-limiting example.

To study the efficiency of the writing process, we performed a molecular dynamics simulation of the switching process from "bit 0" to "bit 1" in the microcanonical ensemble of the $C_{60}^+@C_{480}$ nanoassembly. We used a parametrized linear combination of atomic orbitals (LCAO) total energy functional augmented by long-range Van der Waals interactions. Our approach to determine the forces on individual atoms had been previously used with success to describe the disintegration dynamics of fullerenes and the growth of multi-wall nanotubes. A time step of $5 \times 10^{-16}$ s and a fifth-order Runge-Kutta interpolation scheme was used to guarantee a total energy conservation of $\Delta E/E \sim <10^{-10}$ between successive time steps.

Figure 4A:
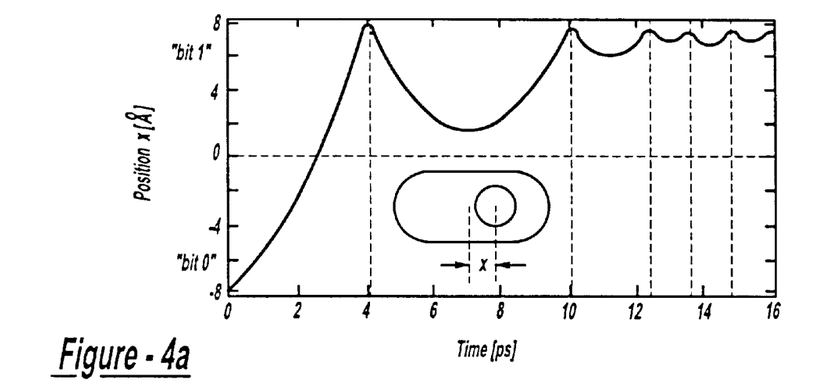
FIG. 4a shows a molecular dynamics simulation of the switching process from "bit 0" to "bit 1" when a constant electric field of 0.1 V/Å is applied along the axis of the nanoassembly, wherein the position of a charged nanostructure with respect to the nanoassembly is a function of time.
Figure 4B:
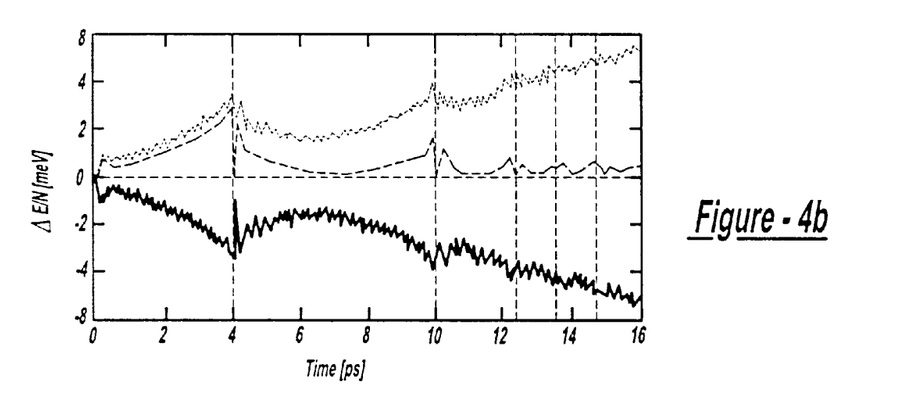
FIG. 4b illustrates the changes in potential energy and kinetic energy as a function of time, wherein the top line is kinetic energy, the bottom line is potential energy, and the middle line is the kinetic energy of the charged nanostructure with respect to the nanoassembly.
Figure 4C:
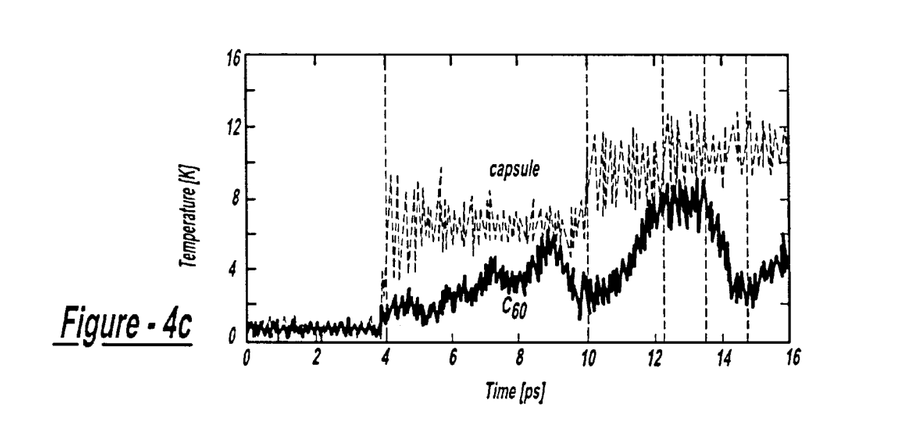
FIG. 4c illustrates the vibrational temperature of the nanoassembly and charged nanostructure as a function of time.

The results of our simulation are shown in FIG. 4. Initially, the nanostructure 20 ($C_{60}^+$ ion) is equilibrated near the "bit 0" position on the left. At time t=0, a constant electric field of 0.1 V/Å is applied along the axis of the nanoassembly 14. The originally stable "bit 0" configuration becomes unstable in the modified total energy surface as depicted in FIG. 2. The $C_{60}^+$ ion is subject to a constant acceleration to the right, and reaches the "bit 1" position only 4 picoseconds (ps) later, as seen in FIG. 4(a). During this switching process, the potential energy lost by the $C_{60}^+$ ion is converted into kinetic energy, as seen in FIG. 4(b). Due to the small (albeit non-negligible) interaction between the nanostructure ($C_{60}^+$ ion) and the nanoassembly (nanotube), the kinetic energy gained initially occurs as rigid-body translational energy of the nanostructure. A nearly negligible energy transfer into the internal degrees of freedom due to atomic-scale friction, manifested in a very small increase of the vibrational temperature, shown in FIG. 4(c), is observed during this initial stage of the switching process.

Approximately four picoseconds (ps) after the switching field is applied, the nanostructure reaches the opposite end of the nanoassembly, having gained 1.5 electron-Volts (eV) of net kinetic energy. This kinetic energy is too small to damage the nanoassembly, as inelastic collisions involving $C_{60}$ require energies exceeding 200 eV to occur. Upon impact onto the enclosing nanoassembly from the inside, a substantial fraction of this energy is converted into heat, thus increasing the vibrational temperature of the nanoassembly by 10 K and that of the $C_{60}^+$ ion nanostructure by 2 K. Due to the high heat conductivity and melting temperature $T_M \sim 4,000$ K of graphitic nanostructures, this modest heat evolution is unlikely to cause any significant structural damage even at high access rates.

As seen in FIG. 4(b), the net kinetic energy of the nanostructure with respect to the nanoassembly is significantly reduced during this collision. The $C_{60}^+$ bounces back towards the middle of the nanoassembly, slowed down by the opposing electric field, and finally turns again towards the "bit 1" end. FIG. 4(c) indicates that thermal equilibration in the system after the collision is achieved stepwise. The step period of 1 ps results from the beats between the low-frequency quadrupolar deformation modes of the colder encapsulated $C_{60}^+$ ion and the hotter enclosing nanoassembly, which have been excited during the quasielastic collision.

One or few oscillations of the nanostructure inside the nanoassembly, damped by transferring energy from macroscopic to internal degrees of freedom, are necessary to stabilize it in the new equilibrium "bit 1" position, with a kinetic energy not exceeding the depth of the trap potential. As seen in FIG. 4(b), this situation occurs 10 ps after the initial onset of the switching field, thus resulting in an ideal memory switching and access rate close to 0.1 THz. In the slower sequential mode, this translates into a data throughput rate of 10 GB/s, many orders of magnitude faster than the data throughput achieved presently in magnetic mass storage devices.

In order to further reduce the switching time, the applied field may be increased to shorten the transfer time between the two states, "bit 0" and "bit 1", keeping in mind that the damping process would be prolonged in such a case. Unlike in our model simulation, there is no need to apply a constant switching field during the entire bit flip process. A 0.5 ps pulse of a 0.1–0.5 V/Å field is found to suffice to detach the $C_{60}^+$ ion from its stable position and thus to change the memory state. This approach may be of particular use if an increase of the trap potential, due to a different fullerene complex, is desired.

Mass production of nano memory devices such as the ones discussed herein can be accomplished in a cost-effective manner due to affinity of nanotubes and nanocapsules to form ordered, close-packed arrays. It should be noted that since any double-wall nanotube or nanocapsule with the enclosed structure shorter than the outer capsule behaves as a tunable two-level system, the functionality of the proposed nanoscale memory device is basically independent of the exact size and shape of the nanostructure and nanoassembly.

Instead of a closed nanoassembly as illustrated and described above, an alternative nanoassembly is shown in FIG. 5 as an open ended hollow tube/cylinder. Two tubes 34 and 34A, smaller in diameter and closed at one end, can be positioned inside the cavity 16 of the nanoassembly 14 in such a way that there is a near cylindrical void between the closed ends 36 and 36A of these two tubes. This cylinder/capsule contains at least one charged nanostructure 20 that can move along the axis of the truncated cylinder portion 38, once an electric field is produced inside by applying a bias voltage between the tubes 34 an 34A. With two equally stable equilibrium states in zero field, this is a two level system that can be used for binary data storage.

While it will be apparent that the preferred embodiments of the invention disclosed are well calculated to fulfill the objects stated, it will be appreciated that the invention is susceptible to modification, variation and change without departing from the spirit thereof.

What is claimed is:

1. A nanomechanism for use in a nanoscale memory element comprising:
   a) a first element in the form of a nanoassembly having a cavity;
   b) a second element in the form of at least one nanostructure disposed within the cavity;
   whereby at least one of the first and second elements are movable relative to the other of said first and second elements to accomplish switching between states.

2. The nanomechanism of claim 1 wherein said nanoassembly is a nanotube.

3. The nanomechanism of claim 2 wherein said nanotube is formed from at least one element selected from group consisting of carbon, boron, nitrogen and mixtures thereof.

4. The nanomechanism of claim 1 wherein said nanostructure is charged.

5. The nanomechanism of claim 1 wherein said nanostructure is in the form of a fullerene molecule.

6. The nanomechanism of claim 5 wherein said fullerene molecule includes a hollow body having a charged particle disposed therein.

7. The nanomechanism of claim 5 wherein said fullerene molecule is charged.

8. The nanomechanism of claim 1 wherein at least one nanostructure includes a plurality of nanostructures contained in the cavity of said nanoassembly.

9. The nanomechanism of claim 8 wherein at least one of said plurality of nanostructures is charged.

10. The nanomechanism of claim 9 wherein at least one of said plurality of nanostructures is a fullerene molecule.

11. The nanomechanism of claim 1 wherein said nanoassembly includes conductive and non-conductive segments.

12. A nanoscale memory element for use in a nanoscale memory device comprising:
   a) a nanomechanism including a first element in the form of a nanoassembly having a cavity and a second element in the form of at least one nanostructure disposed within the cavity; and
   b) an activator for moving at least one of the first and second elements relative to the other of said first and second elements to accomplish a switching between states.

13. The nanoscale memory element of claim 12 wherein said nanoassembly is a nanotube.

14. The nanoscale memory element of claim 13 wherein said nanotube is formed from at least one element selected from the group consisting of carbon, boron, nitrogen and mixtures thereof.

15. The nanoscale memory element of claim 12 wherein said nanostructure is charged.

16. The nanoscale memory element of claim 12 wherein said nanostructure is in the form of a fullerene molecule.

17. The nanoscale memory element of claim 16 wherein said fullerene molecule includes a hollow body having a charged particle disposed therein.

18. The nanoscale memory element of claim 16 wherein said fullerene molecule is charged.

19. The nanoscale memory element of claim 12 wherein at least one nanostructure includes a plurality of nanostructures contained in the cavity of said nanoassembly.

20. The nanoscale memory element of claim 19 wherein at least one of said plurality of nanostructures is charged.

21. The nanoscale memory element of claim 19 wherein at least one of said plurality of nanostructures is a fullerene molecule.

22. The nanoscale memory element of claim 12 wherein said activator includes an article for applying an electric field which is disposed in proximity to said nanomechanism.

23. The nanoscale memory element of claim 22 wherein said article is an electrode attached at a first end to said nanomechanism and at a second end to a power source.

24. The nanoscale memory element of claim 22 wherein said article includes a plurality of electrodes attached at a first end to said nanomechanism and at a second end to a power source.

25. The nanoscale memory element of claim 24 wherein said plurality of electrodes includes a first electrode attached to said nanomechanism along a first end and a second electrode attached to said nanomechanism along a second end.

26. The nanoscale memory element of claim 25 wherein at least one additional electrode is attached to said nanomechanism between said first and second electrodes.

27. The nanoscale memory element of claim 26 wherein each of said electrodes are equidistantly spaced from adjacent electrodes.

28. The nanoscale memory element of claim 12 wherein said activator is a source of electromagnetic radiation causing a change of state.

29. The nanoscale memory element of claim 28 wherein said source of electromagnetic radiation is a laser.

30. The nanoscale memory element of claim 12 wherein said nanoassembly includes conductive and non-conductive segments.

31. The nanoscale memory element of claim 12 further comprising a detector for identifying the state of said nanomechanism.

32. A nanoscale memory element comprising:
   a) a nanomechanism including a first element in the form of a nanoassembly having a cavity and a second element in the form of at least one nanostructure disposed within the cavity, whereby at least one of the first and second elements move relative to the other of said first and second elements to accomplish a switching between states; and
   b) a detector for identifying the state of said nanomechanism.

33. The nanoscale memory element of claim 32 wherein said nanoassembly is a nanotube.

34. The nanoscale memory element of claim 33 wherein said nanotube is formed from at least one element selected from the group consisting of carbon, boron, nitrogen and mixtures thereof.

35. The nanoscale memory element of claim 32 wherein said nanostructure is charged.

36. The nanoscale memory element of claim 32 wherein said nanostructure is in the form of a fullerene molecule.

37. The nanoscale memory element of claim 36 wherein said fullerene molecule includes a hollow body having a charged particle disposed therein.

38. The nanoscale memory element of claim 36 wherein said fullerene molecule is charged.

39. The nanoscale memory element of claim 32 wherein at least one nanostructure includes a plurality of nanostructures contained in the cavity of said nanoassembly.

40. The nanoscale memory element of claim 39 wherein at least one of said plurality of nanostructures is charged.

41. The nanoscale memory element of claim 39 wherein at least one of said plurality of nanostructures is a fullerene molecule.

42. The nanoscale memory element of claim 32 wherein said detector includes a device for applying an electric field which is disposed in proximity to said nanomechanism.

43. The nanoscale memory element of claim 42 wherein said device is an electrode attached at a first end to said nanomechanism and at a second end to a power source.

44. The nanoscale memory element of claim 42 wherein said device includes a plurality of electrodes attached at a first end to said nanomechanism and at a second end to a power source.

45. The nanoscale memory element of claim 44 wherein said plurality of electrodes includes a first electrode attached to said nanomechanism along a first end and a second electrode attached to said nanomechanism along a second end.

46. The nanoscale memory element of claim 45 wherein at least one additional electrode is attached to said nanomechanism between said first and second electrodes.

47. The nanoscale memory element of claim 46 wherein each of said electrodes are equidistantly spaced from adjacent electrodes.

48. The nanoscale memory element of claim 47 wherein the middle electrode and at least one other electrode is used to measure electrical resistance.

49. The nanoscale memory element of claim 47 wherein a circuit is utilized to read the electrical resistance to thereby determine the state of the nanoscale memory element.

50. The nanoscale memory element of claim 42 wherein the location of the nanostructure is determined by the electrical polarity of the nanoscale memory element.

51. The nanoscale memory element of claim 32 wherein nanoassembly includes conductive and non-conductive segments.

52. The nanoscale memory element of claim 51 wherein the electrical resistance of the nanoscale memory element varies due to the location of the nanostructure with respect to the conductive and non-conductive sections of the nanoassembly.

53. The nanoscale memory element of claim 52 wherein the variation in electrical resistance is used to detect the state of the nanoscale memory element.

54. The nanoscale memory element of claim 32 where the detector is a nanoprobe.

55. The nanoscale memory element of claim 54 wherein said nanoprobe is a scanning probe microscope.

56. The nanoscale memory element of claim 32 wherein the detector is an apparatus for measuring the optical properties of the nanoscale memory element.

57. The nanoscale memory element of claim 32 wherein said nanoassembly includes conductive and non-conductive segments.

58. The nanoscale memory element of claim 32 wherein said nanoscale memory element is also comprised of an activator for moving at least one of the first and second elements relative to the other of said first and second elements.

59. A nanoscale memory device comprising:
  a nanoscale memory element including:
    a) a first element in the form of a nanoassembly having a cavity and a second element in the form of at least one nanostructure disposed within the cavity; and
    b) an activator for moving at least one of the first and second elements relative to the other of said first and second elements to accomplish said switching between multiple states; and
    c) a detector for identifying the state of said nanomechanism; and
  a circuit for monitoring a change in state of said nanoscale memory element.

60. The nanoscale memory device of claim 59 wherein said activator includes an article for applying an electric field which is disposed in proximity to said nanomechanism.

61. The nanoscale memory device of claim 59 wherein said article is an electrode attached at a first end to said nanomechanism and at a second end to a power source.

62. The nanoscale memory device of claim 61 wherein said article includes a plurality of electrodes attached at a first end to said nanomechanism and at a second end to a power source.

63. The nanoscale memory device of claim 62 wherein said plurality of electrodes includes a first electrode attached to said nanomechanism along a first end and a second electrode attached to said nanomechanism along a second end.

64. The nanoscale memory device of claim 63 wherein at least one additional electrode is attached to said nanomechanism between said first and second electrodes.

65. The nanoscale memory device of claim 64 wherein each of said electrodes are equidistantly spaced from adjacent electrodes.

66. The nanoscale memory device of claim 59 wherein said activator is a source of electromagnetic radiation causing a change of state.

67. The nanoscale memory device of claim 59 wherein the location of the nanostructure is determined by the electrical polarity of the nanoscale memory element.

68. The nanoscale memory device of claim 59 wherein said nanoassembly includes conductive and non-conductive segments.

69. The nanoscale memory device of claim 59 wherein the electrical resistance of the nanoscale memory device varies due to the location of the nanostructure with respect to the conductive and non-conductive sections of the nanoassembly.

70. The nanoscale memory device of claim 69 wherein the variation in electrical resistance is used to detect the state of the nanoscale memory element.

71. The nanoscale memory device of claim 59 where the detector is a nanoprobe.

72. The nanoscale memory device of claim 71 wherein said nanoprobe is a scanning probe microscope.

73. The nanoscale memory device of claim 59 wherein the detector is an apparatus for measuring the optical properties of the nanoscale memory element.

74. The nanoscale memory device of claim 59 wherein the state of the nanoscale memory element can be restored to a pre-existing state.

75. The nanoscale memory device of claim 59 further comprising an array of nanoscale memory elements arranged such that at least one bit of information can be stored.

76. The nanoscale memory device of claim 75 wherein said array includes conducting electrodes which are used to address the units of information, either singly or in groups.

77. The nanoscale memory device of claim 76 wherein said electrodes are formed from at least one material selected from the group consisting of metals, polysilicon and conductive nanotubes.

78. The nanoscale memory device of claim 76 wherein one function of said electrodes is to conduct electrical signals which cause a state change to occur in said nanomechanisms.

79. The nanoscale memory device of claim 76 wherein one function of said electrodes is to conduct electrical signals allowing the state of the device to be determined.

80. The nanoscale memory device of claim 76 wherein said electrodes transmit information to a computer for analysis.

81. The nanoscale memory device of claim 76 wherein the number of electrodes required is roughly proportional to the square root of the number of bits stored.

82. The nanoscale memory device of claim 59 wherein said device can be used as a high density memory board.

83. The nanoscale memory device of claim 59 wherein said device can be utilized in a lithography apparatus.

* * * * *

UNITED STATES PATENT AND TRADEMARK OFFICE
CERTIFICATE OF CORRECTION

PATENT NO. : 6,473,351 B2
DATED : October 29, 2002
INVENTOR(S) : David Tomanek, Richard Enbody and Young-Kyun Kwon It is certified that error appears in the above-identified patent and that said Letters Patent is hereby corrected as shown below:

<u>Title page,</u>
Item [75], Inventors, "Kwon Young-Kyun" should read -- Young-Kyun Kwon --.
Item [57], ABSTRACT,
Line 11, "hd 60" should read -- $C_{60}$ --.
Line 13, "non-0volatility" should read -- non-volatility --.

<u>Column 1,</u>
Line 12, before "Field of Invention", insert:

-- This invention was made with Government support under contract
US NAVY N00014-99-1-0252. The Government has certain rights in the
invention. --

<u>Column 4,</u>
Line 22, "if" should read -- is --.

<u>Column 8,</u>
Line 65, "an" should read -- and --.

<u>Column 12,</u>
Line 1, insert -- d) -- at beginning of line.

Signed and Sealed this

Nineteenth Day of August, 2003

JAMES E. ROGAN
*Director of the United States Patent and Trademark Office*